(12) United States Patent
Nakasuji

(10) Patent No.: US 6,388,261 B1
(45) Date of Patent: May 14, 2002

(54) CHARGED-PARTICLE-BEAM MICROLITHOGRAPHY APPARATUS AND METHODS EXHIBITING REDUCED ASTIGMATISMS AND LINEAR DISTORTION

(75) Inventor: Mamoru Nakasuji, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/393,012

(22) Filed: Sep. 10, 1999

(30) Foreign Application Priority Data

Sep. 25, 1998 (JP) .......................................... 10-287337

(51) Int. Cl.⁷ ............................................. H01J 37/141
(52) U.S. Cl. ..................................... 250/398; 250/492.2
(58) Field of Search ............................. 250/398, 492.2, 250/492.22, 396 ML

(56) References Cited

U.S. PATENT DOCUMENTS 6,027,841 A * 2/2000 Suzuki ........................ 430/30
6,066,855 A * 5/2000 Simizu ................... 250/492.22
6,087,669 A * 7/2000 Suzuki ................... 250/492.23
6,204,509 B1 * 3/2001 Yahiro et al. ................ 250/397

OTHER PUBLICATIONS

Binder et al., "Accuracy Requirements for Adjusting Variable–Shaped Beam Systems for the Production of Submicron Patterns," *J. Vac. Sci. Technol. 16*: 1723–1725 (1979).

* cited by examiner

*Primary Examiner*—Bruce Anderson
(74) *Attorney, Agent, or Firm*—Klarquist Sparkman LLP

(57) ABSTRACT

Apparatus and methods are disclosed for making accurate yet simple corrections of astigmatism that would otherwise degrade edge resolution and astigmatism, and cause linear distortion of, a reticle image. Astigmatism that would otherwise degrade edge resolution of the reticle image is corrected by a stigmator lens (including a respective set of stigmator coils) having a principal plane coincident with a plane of a contrast aperture. Linear distortion of the reticle image is corrected by a separate stigmator lens (including a respective pair of stigmator coils) having a principal plane coincident with the principal plane of a projection lens.

20 Claims, 2 Drawing Sheets ained by the charged particle beam, and thus projected onto the substrate, individually one at a time in an ordered manner. The subfields are controllably projected onto the substrate such that each projected subfield is in the proper position and alignment, relative to the other projected subfields, to form the complete pattern on the substrate. As each subfield is illuminated, certain operational parameters of the CPB optical system can be changed as required from subfield to subfield to achieve improved image resolution and alignment relative to the other projected subfields. This technique of "partitioning" the reticle pattern into individually projected subfields is disclosed, for example, in U.S. Pat. No. 5,260,151, incorporated herein by reference.

CHARGED-PARTICLE-BEAM MICROLITHOGRAPHY APPARATUS AND METHODS EXHIBITING REDUCED ASTIGMATISMS AND LINEAR DISTORTION

FIELD OF THE INVENTION

The present invention pertains to microlithography apparatus and methods as used in the manufacture of, e.g., semiconductor integrated circuits and display devices. More specifically, the invention pertains to such microlithography apparatus and methods that employ a charged particle beam (e.g., electron beam or ion beam) as an energy beam. Even more specifically, the invention pertains to charged-particle-beam (CPB) microlithography apparatus and methods exhibiting improved correction of astigmatisms that otherwise would cause linear distortion and degradation of edge resolution of the pattern image.

BACKGROUND OF THE INVENTION

Conventional charged-particle-beam (CPB) microlithography methods and apparatus are exemplified by electron-beam microlithography methods and apparatus. Such conventional apparatus and methods embody any of several approaches. One approach, termed "character projection" exposure, is used for transferring patterns comprising pattern portions that are highly repeated (e.g., as found in DRAM patterns). In character projection exposure, the pattern image (defined by a reticle) is demagnified ("reduced") as the image is being projected onto the substrate (e.g., semiconductor wafer). The reticle defines the repeating portions of the pattern (for a DRAM, each repeating portion measures, e.g., about 5 μm square on the substrate). The non-repeating portions of the pattern are separately written directly onto the substrate using another method such as the "variable-shaped-beam" writing technique.

The character projection exposure technique provides a substantially improved "throughput" (number of wafer substrates that can be processed per unit time) over the variable-shaped-beam writing technique. However, the throughput realized using the character projection exposure technique is too low, by at least an order of magnitude, to be practical for industrial-scale production of actual semiconductor integrated-circuit devices, including DRAMs.

A technique that has been proposed for improving throughput over the character projection exposure technique involves illumination of the entire reticle pattern for a semiconductor device onto the substrate in one exposure or "shot" of the charged particle beam. To project the (usually demagnified) image, a two-stage projection lens is used. An example of such a technique is discussed in Japanese Laid-Open ("Kokai") Patent Application No. Hei 5-160012.

Frequently, projection of the entire reticle pattern in a single shot cannot be realized due to practical constraints. For example, larger patterns require CPB optics having correspondingly larger fields; thus, the physical size of the CPB optics must be correspondingly larger. Simply increasing the size of the CPB optics as required for a larger pattern tends to introduce a myriad of other problems that generally degrade image resolution and projection accuracy.

To address such problems, the reticle pattern is divided into multiple subfields each defining a respective portion of the overall reticle pattern. As a result, the CPB optics can be much smaller than would otherwise be necessary for single-shot exposure of the entire pattern. Each subfield is typically sized and shaped to correspond to the size and shape of the field of the CPB optical system. The subfields are illumi- All the conventional CPB microlithography apparatus and methods summarized above tend to exhibit an unacceptable degree of linear distortion. Linear distortion can cause, for example, a square subfield to be imaged onto the substrate as a rectangle, or a parallelogram-shaped subfield to appear warped when projected onto the substrate.

Conventional electron-beam microlithography apparatus as used for variable-shaped-beam transfer methods employ an aperture to control beam shape and size. Stigmator lenses are used to reduce linear distortion of an image of the aperture. In a stigmator lens used in such apparatus, the lens center can be shifted as required within a plane perpendicular to the optical axis (i.e., shifted in the X and Y directions). The stigmator lens is usually configured as a pair of quadrupole coils that are rotationally displaced, about the optical axis, from each other by 45 degrees. Shifting of the lens center is performed by changing the magnetic-field strengths of the quadrupoles relative to each other.

Stigmators are generally used to reduce either or both of the following problems: astigmatism that would otherwise degrade the edge resolution of the reticle image, and linear distortion of the reticle image. Conventionally, correcting either of these problems tends to aggravate the other problem. As a result, in order to establish conditions adequate for satisfactorily reducing both problems, the corrections must be repeated many times. Hence, a large number of stigmators are conventionally required, which substantially increases cost and complexity, and imposes accompanying greater burdens of controlling the entire CPB optical system in a coordinated manner.

SUMMARY OF THE INVENTION

In view of the foregoing, an object the present invention is to provide charged-particle-beam (CPB) microlithography apparatus and methods offering precise yet simple correction of any of several types of astigmatisms, including astigmatism that would otherwise degrade edge resolution of the reticle image, and astigmatism that would otherwise cause linear distortion of the reticle image. It is a further object that such corrections be performed without the need to make the corrections multiple times.

To such ends, and according to a first aspect of the invention, CPB microlithography apparatus are provided that comprise an illumination-optical system for illuminating, with a charged particle beam, a pattern defined on a reticle. Such an apparatus also includes a projection-optical system for projection-imaging, on a sensitive substrate, a charged particle beam that has passed through the reticle. The projection-optical system comprises at least one stigmator lens each comprising first and second respective stigmator coils. Each stigmator lens has a principal plane aligned with a specific position on the optical axis of the projection-optical system. The principal plane is adjustable by setting or adjusting the ratio of magnetic-field strengths and convergence/divergence of the respective stigmator coils.

By way of example, and according to an especially advantageous embodiment, the first stigmator coil is energized to produce a magnetic-field strength denoted by $A_1$, and the second stigmator coil is energized to produce a magnetic-field strength denoted by $A_2$. Also, the first stigmator coil is located an axial distance $a_1$ from the principal plane of the stigmator lens, and the second stigmator coil is located an axial distance $a_2$ from the principal plane of the stigmator lens. The respective axial distances and magnetic-field strengths are related according to $a_1 A_1 = a_2 A_2$.

The foregoing and additional features and advantages of the invention will be more readily apparent from the following detailed description, which proceeds with reference to the accompanying drawings.

DETAILED DESCRIPTION

Figure 1:
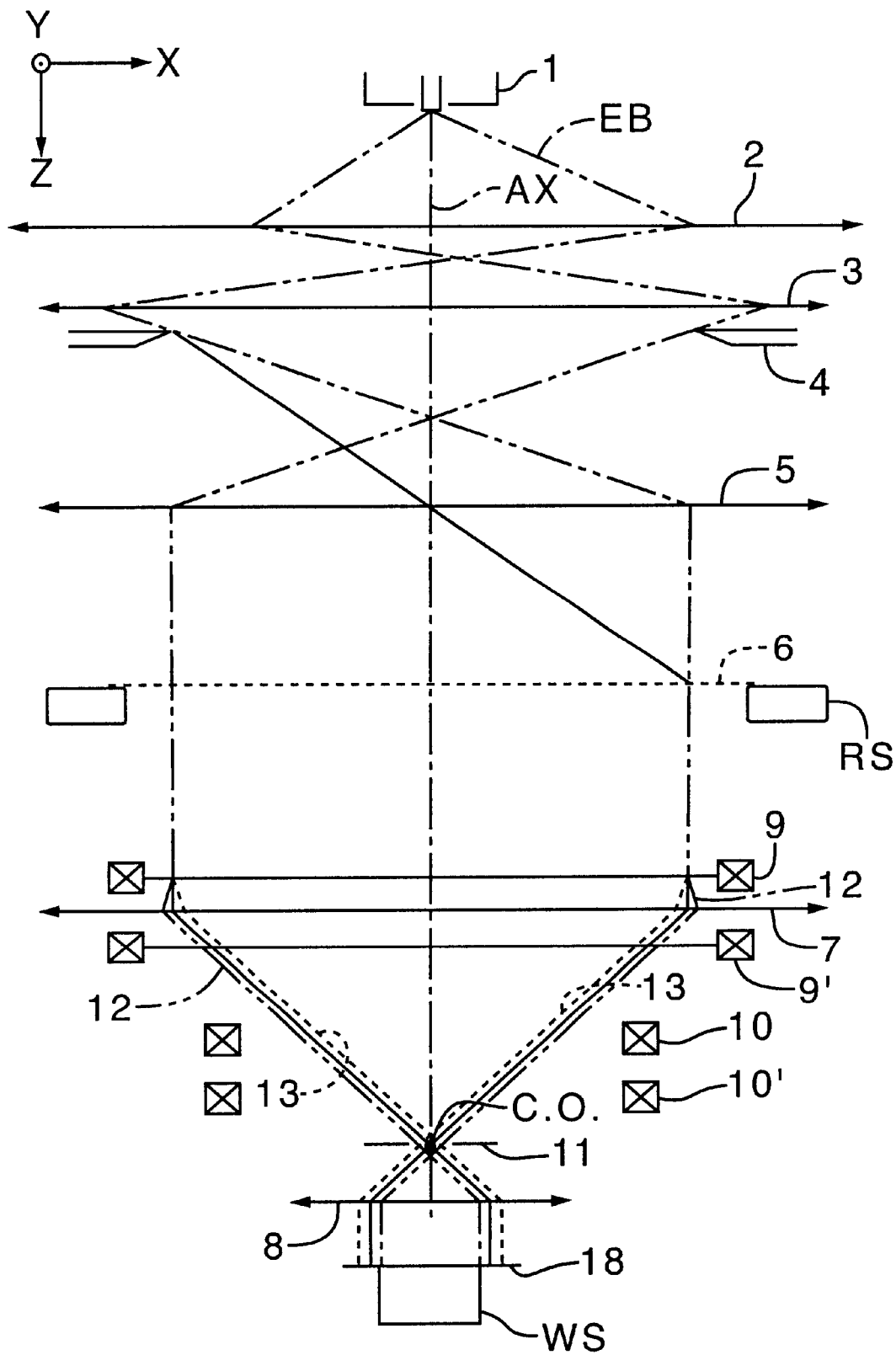
FIG. 1 is a schematic optical diagram showing certain imaging relationships of the CPB optical system of an electron-beam image-reduction microlithography apparatus according to a representative embodiment of the present invention.

A representative embodiment of a charged-particle-beam (CPB) microlithography apparatus according to the invention comprises an illumination-optical system, situated on an optical axis between a CPB source and a reticle, and a projection-optical system situated between the reticle and a sensitive substrate. (A substrate is made "sensitive" to exposure to the charged particle beam by applying a layer of a suitable "resist" to the exposable surface of the substrate.) The illumination-optical system is situated and configured to illuminate, with a charged particle beam produced by and propagating downstream of the CPB source, a pattern defined on the reticle. The projection-optical system is situated and configured to projection-image, on the sensitive substrate, a charged particle beam that has passed through a region of the reticle illuminated by the charged particle beam. The projection-optical system comprises first and second projection lenses and a contrast aperture that prevents charged particles scattered by the reticle from propagating toward the sensitive substrate. The projection-optical system also includes a first stigmator lens, comprising stigmator coils that form a first coil group, and desirably a second stigmator lens comprising stigmator coils that form a second coil group. The principal plane of the first stigmator lens coincides with the principal plane of a projection lens of the projection-optical system. The second stigmator lens, if present, has a principal plane that coincides with the principal plane of the contrast aperture.

Astigmatism, that otherwise would degrade the edge resolution of the reticle image, can be corrected by the second stigmator lens (having a principal plane coincident with the contrast aperture). Such correction does not, in contrast with conventional apparatus, generate a new astigmatism that would otherwise cause a linear distortion of the reticle image. Such new astigmatisms are not generated because, with the principal plane of the second stigmator lens being located at the plane of the contrast aperture, the principal ray of the charged particle beam passes through a portion of the contrast aperture that is at or very near the optical axis, thereby avoiding generation of linear distortions.

Linear distortion of the reticle image can be corrected by the first stigmator lens (having a principal plane located in the principal plane of the first projection lens). Any new astigmatism, that would otherwise degrade reticle-edge resolution, generated by such correction is at most extremely small because the ability of a stigmator lens to cause (or correct) reticle-image linear distortion is greatest when the stigmator lens is located in the principal plane of a projection lens. The ability of a stigmator lens to cause (or correct) astigmatism that degrades edge resolution is essentially constant between the principal planes of the first and second projection lenses.

Thus, apparatus according to the invention achieve independent correction of astigmatism that would otherwise cause degradation of reticle-image edge resolution, and astigmatism that would otherwise cause linear distortion of the reticle image. Such independent correction can be made to a remarkably high degree by using only two stigmator lenses, wherein each stigmator lens typically is dedicated to correcting a respective astigmatism.

FIG. 1 schematically depicts a CPB optical system for a representative embodiment of an apparatus according to the invention. The FIG. 1 configuration is especially suitable for use of an electron beam as a representative charged particle beam. However, it will be understood that any of various other charged particle beams can be used with this configuration, such as an ion beam. FIG. 1 also shows certain imaging relationships of this embodiment. An electron gun 1 in the upper portion of the figure emits an electron beam EB that propagates downstream of the electron gun 1 along an optical axis AX. Downstream of the electron gun 1 are a first-stage condenser lens 2 and a second stage condenser lens 3. The electron beam EB (as an "illumination beam") passes through the condenser lenses 2 and 3 to form a crossover image downstream of the condenser lens 3. The condenser lenses 2 and 3 can be operated collectively as a zoom lens to vary the current density of the illumination beam with which a reticle 6 is illuminated.

Downstream of the condenser lenses 2 and 3 is a field-limiting aperture 4. The field-limiting aperture 4, defining for example a rectangularly shaped opening for passage of the illumination beam, desirably limits the transverse size of the illumination beam passing through the field-limiting aperture to an area corresponding to one subfield (a single "exposure unit") on the reticle 6.

Situated downstream of the field-limiting aperture 4 is a field-selection deflector (not shown) that is used, for example, for sequentially scanning the illuminating beam in the X direction (horizontally in FIG. 1) over the reticle. Thus, all of the subfields aligned in the scanning direction can be exposed. An illumination lens 5 is desirably situated just upstream of the reticle 6. The illumination lens 5 collimates the illumination beam striking the reticle 6 so as to form an image of the field-limiting aperture 4 on the reticle 6.

In FIG. 1, only one reticle subfield (actually located on the optical axis AX) is shown. The reticle 6 actually extends farther outward in the X and Y directions (i.e., in a plane perpendicular to the optical axis AX), and has multiple subfields. To illuminate/expose each subfield, the electron beam EB is appropriately laterally deflected by the field-selection deflector.

The reticle 6 is mounted on a reticle stage RS that is movable in the X and Y directions. Similarly, a wafer 18 (as a representative sensitive substrate) is mounted on a wafer stage WS that is movable in the X and Y directions. By scanning the reticle stage RS and wafer stage WS in opposite directions in conjunction with the deflection of the electron beam EB, each of the multiple subfields of the reticle 6 is individually exposed.

Situated downstream of the reticle 6 are first and second projection lenses 7 and 8, respectively, and a subfield-image stitching deflector (not shown). Thus, the projection lenses 7, 8 define a two-stage projection-lens system. The electron beam, after passing through the illuminated subfield of the reticle 6, is termed an "imaging beam." The imaging beam is demagnified by the projection lenses 7, 8 and appropriately deflected by the subfield-image stitching deflector to form an image of the illuminated reticle subfield in a prescribed location on the wafer 18. The wafer 18 is surficially coated with an appropriate resist that, when exposed with an appropriate dose of the imaging beam, is imprinted with a latent image of the illuminated reticle subfield.

Each of the reticle stage RS and the wafer stage WS is provided with a high-precision position-measurement system employing laser interferometers (not shown). During exposure, positional adjustments of the stages are performed using separate actuators and alignment means, and positioning of the electron beam is performed using deflectors; all these actions concertedly serve to accurately stitch the projected subfields together on the wafer 18.

Situated above and below the first projection lens 7, equidistant from the principal plane of the first projection lens 7, are a first pair of stigmator coils 9, 9' (collectively constituting a first "stigmator lens"). Each stigmator coil 9, 9' can be a conventional octapole (pair of quadrupoles) stigmator. The magnetic-field strength of each stigmator coil 9, 9' is desirably equal, with similar directions of convergence and divergence. From a theoretical standpoint, it is preferred that both stigmator coils 9, 9' be located on the principal plane of the first projection lens 7. However, from a practical standpoint, insufficient space is available for such a configuration, especially since a deflector (serving to correct off-axis aberrations generated by the projection lens) is normally provided in the same plane as the principal plane of the first projection lens 7. Hence, the arrangement shown in FIG. 1 is a compromise configuration in view of practical space constraints. The operation of the stigmator coils will be described later.

A crossover C.O. is formed at an axial point representing a division of the axial distance between the reticle 6 and wafer 18 in proportion to the demagnification ratio of the projection-lens system. (The "demagnification ratio" is the reciprocal of the factor by which the image as formed on the wafer 18 is smaller than the corresponding illuminated subfield on the reticle 6.) Situated at the crossover C.O. is a contrast aperture 11. The contrast aperture 11 acts as a shield that blocks electrons scattered by non-patterned regions of the reticle 6 from reaching the wafer 18. By way of example, if the second projection lens 8 has a focal length of 50 mm and a convergence radius of 6 mrad, then the contrast aperture 11 desirably has a diameter (D) of:

$$D=2(50 \text{ mm})(6\times10^{-3} \text{ rad})=0.6 \text{ mm},$$

which desirably is increased slightly to about 0.75 mm to allow some additional off-axis room.

Desirably situated upstream of the contrast aperture 11 is a second pair of stigmator coils 10, 10' (collectively constituting a second "stigmator lens"). If present, the stigmator coils 10, 10' are desirably situated such that, if the distances between the contrast aperture 11 and the stigmator coils 10 and 10' are $a_1$ and $a_2$, respectively, and the magnetic-field strengths of the stigmator coils 10 and 10' are $A_1$ and $A_2$, respectively, then the relationship between these distances and magnetic-field strengths is $a_1A_1=a_2A_2$. Also, the coils 10, 10' are desirably disposed so as to create respective astigmatism-correcting magnetic fields differing in phase from each other by effectively 90 degrees. ("Effectively" in this context means taking into account any image rotation imparted by a projection lens situated between the first and second stigmators. I.e., if the projection lens has imparted a slight image rotation, then the respective phases of the first and second stigmators may deviate from a perfect 90-degree relationship by an amount equal to the image rotation, as discussed further below.) In this regard, for example, the coils 10, 10' are disposed such that, if the coil 10 causes beam convergence in the X direction and beam divergence in the Y direction, then the coil 10' is oriented to cause beam divergence in the X direction and beam convergence in the Y direction. Such a configuration causes the principal plane of the second stigmator lens to fall outside of (downstream of) the axial space occupied by the stigmator coils 10, 10'.

Figure 2:
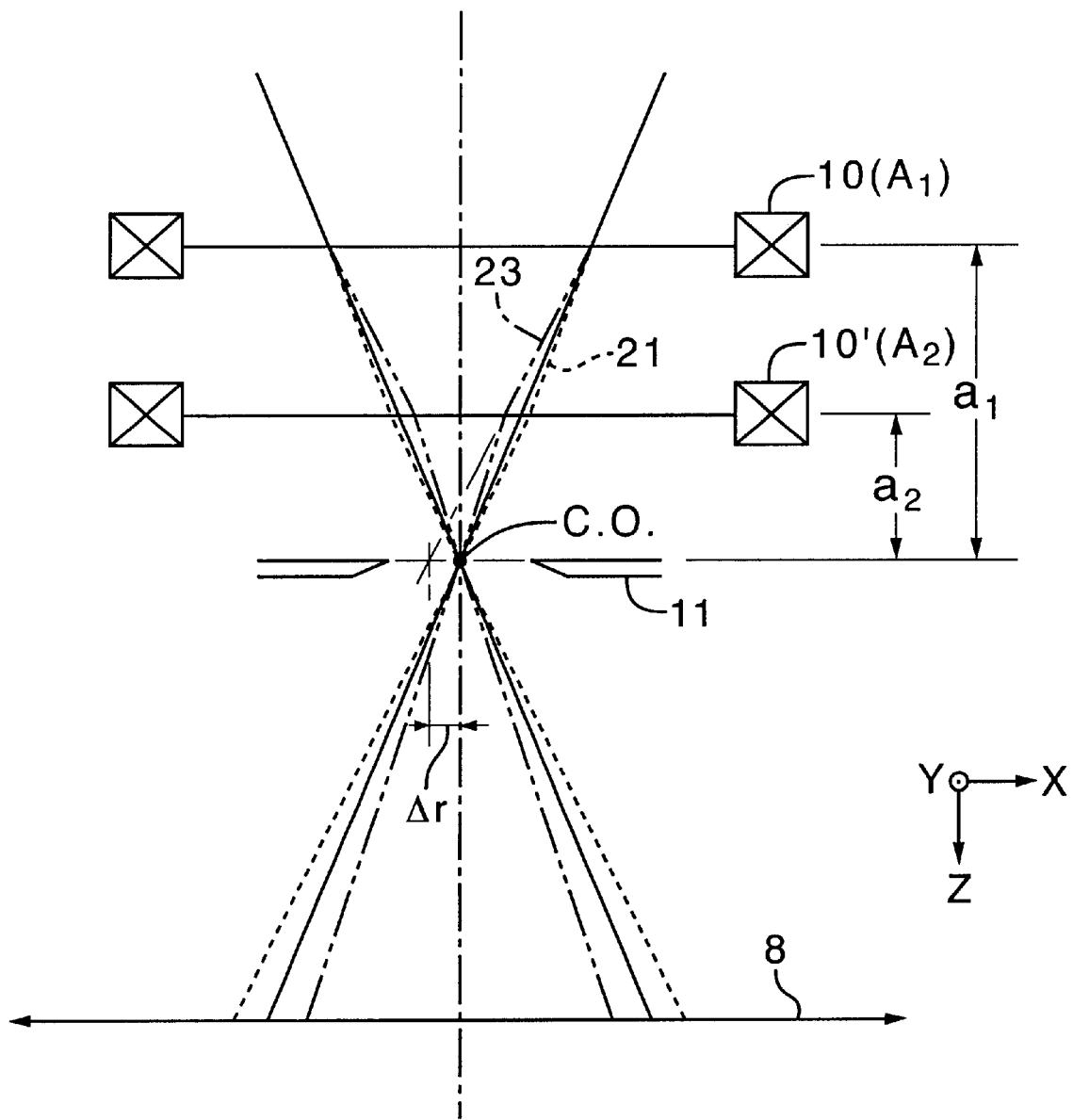
FIG. 2 provides further explanatory detail of the operation of stigmator coils 10, 10' situated upstream of the crossover aperture 11 in the FIG. 1 embodiment.

In other words, for example and referring to FIG. 2, assume that the field produced by the coil 10 is convergent in the X direction and divergent in the Y direction, and that the field produced by the coil 10' is divergent in the X direction and convergent in the Y direction. Thus, in the X direction, the principal ray is converged by the coil 10 and diverged by the coil 10', as indicated by the dot-dashed line 23. The amount ($\Delta r$) that the principal ray is deviated from the optical axis at the crossover C.O. is $\Delta r=A_1a_1$. If this deviation were to be corrected by the coil 10', then $\Delta r=A_2a_2$. If $A_1a_1=A_2a_2$, then the principal plane of the coils 10 and 10' coincide with the plane of the contrast aperture 11, as shown in FIG. 2. If the assumptions are reversed from those indicated above, then the principal ray follows the trajectory indicated by the dotted line 21.

The configuration of the second stigmator lens as described above takes into account the fact that the second projection lens 8 as well as associated deflectors are already situated in the confined space between the contrast aperture 11 and the wafer 1 8. Such crowding makes it difficult to spatially accommodate the stigmator coils 10, 10'.

Next, the operation of the stigmator coils 9, 9' (of the first stigmator lens) and stigmator coils 10, 10' (of the second stigmator lens) will be described. In FIG. 1, the dotted line 13 denotes a typical converging ray and the dot-dashed line 12 denotes a typical diverging ray. In the following description, it is assumed that measurements were obtained of subfield linear distortion and that such measurements revealed a demagnification in a given X or Y direction that is less than in the corresponding orthogonal X or Y direction, causing a parallelogram linear distortion. It is also assumed that, when the first stigmator lens (coils 9, 9') operates, its lens action in the given direction is of a diverging lens (ray 12), and that its lens action in the corresponding orthogonal direction is of a converging lens (ray 13).

Next, the phase relationships of the coils 9 and 9' are described. The magnetic-field strengths of the two coils 9, 9' are desirably equal. The lens action of the coil 9, at the position of coil 9', is rotated by an amount equal to the integral, between the coils 9 and 9', of the magnetic field produced by the first projection lens 7. If the coils 9, 9' are rotated relative to each other by an amount corresponding to the amount of this rotation, then the phases of the stigmator coils 9, 9' will be "effectively" (as used herein) the same.

Under such conditions, the respective loci of the diverging ray 12 and the converging ray 13 are as shown in the drawing. This reduces the demagnification ratio in the given direction and increases the demagnification ratio in the orthogonal direction, thereby correcting the parallelogram linear distortion of the subfield image.

Because the principal plane of the first stigmator lens (consisting of the stigmator coils 9 and 9') is coincident with the principal plane of the first projection lens 7, the first stigmator lens provides a highly effective correction of distortion of the subfield image. Such a configuration also introduces very little astigmatism of the type that results in degradation of pattern-edge resolution.

Operation of the stigmator coils 10, 10' (of the second stigmator lens) is now described with reference to FIG. 2. In this description, it is assumed that the lens action of the coil 10 in a given direction is divergent (dotted line, ray 21) and that the lens action in a direction orthogonal to the given direction is convergent (dot-dashed line, ray 23). Because the lens action (i.e., phase of respective magnetic field) of the stigmator coil 10' differs from the lens action of the coil 10 by "effectively" 90 degrees, the ray undergoing convergence due to the coil 10 (ray 23, dot-dashed line) undergoes divergence due to the coil 10'.

Similarly, the ray undergoing divergence due to the coil 10 (ray 21, dotted line) undergoes convergence due to the coil 10'.

The ratio of the relative magnetic-field strengths of the coils 10 and 10' can be adjusted, along with the respective rotation of the direction of astigmatism correction. Rotational adjustments (from a 90-degree relationship) are performed so as to account for an amount of image rotation, between the positions of the coils 10 and 10', due to the magnetic field of the first projection lens 7 (FIG. 1). In other words, the "effectively" 90-degree phase relationship of the correcting magnetic fields is determined by the coils 10 and 10', with a corresponding accounting of the amount of beam rotation. This enables the principal plane of the second stigmator lens (coils 10 and 10') to be placed at the position of the crossover aperture 11. Such a configuration provides effective correction of astigmatism that would otherwise adversely affect pattern-edge resolution. Even if the magnetic-field strength of the coil 10' were to be adjusted, a ray passing through the optical axis at the principal plane of a lens is not refracted by that lens. Hence, a principal ray emerging from the reticle 6 at a position displaced from the optical axis is not refracted by this stigmator lens, and the stigmator lens introduces no new linear distortion of the subfield.

Whenever the linear subfield distortion is corrected by the first stigmator, the correction can generate new pattern-edge degradations. Hence, after correction of the linear subfield distortion, it is desirable to correct pattern-edge degradation using a second stigmator.

As is clear from the foregoing discussion, the present invention provides CPB microlithography apparatus and methods allowing precise and simple correction of astigmatism that would otherwise degrade the edge resolution of a reticle image, as well as astigmatism that would otherwise cause linear distortion of the reticle image.

Whereas the invention has been described in connection with preferred embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A charged-particle-beam microlithography apparatus, comprising:
   (a) an illumination-optical system situated and configured relative to a charged-particle-beam source and a pattern-defining reticle so as to direct a charged-particle illumination beam from the source to illuminate a region of the pattern defined by the reticle;
   (b) a projection-optical system situated on an optical axis extending between the reticle and a sensitive substrate, the projection optical system being configured to receive an imaging beam, generated by passage of a portion of the illumination beam through the illuminated region of the reticle, and cause the imaging beam to form an image of the illuminated region on a corresponding region of the sensitive substrate; and
   (c) the projection-optical system comprising a stigmator lens comprising at least two stigmator coils each generating, when energized, a respective magnetic-field strength and each exhibiting a respective convergence or divergence of the imaging beam, the stigmator lens having a principal plane at a position on the optical axis, the position being a function of a ratio of the respective magnetic-field strengths and respective degrees of convergence or divergence exhibited by the stigmator coils.

2. The apparatus of claim 1, wherein:
   the first stigmator coil, when energized, generates a magnetic-field strength ($A_1$) and is located an axial distance ($a_1$) from the principal plane of the stigmator lens;
   the second stigmator coil, when energized, generates a magnetic-field strength ($A_2$) and is located an axial distance ($a_2$) from the principal plane of the stigmator lens; and
   the respective axial distances and magnetic-field strengths are related according to $a_1 A_1 = a_2 A_2$.

3. The apparatus of claim 1, wherein the first and second stigmator coils are located equidistantly from the principal plane of the stigmator lens and, when energized, generate respective magnetic fields of equal strength and effectively equal direction.

4. The apparatus of claim 1, wherein:
   the first and second stigmator coils are located on the same axial side of the principal plane of the stigmator lens; and
   the magnetic fields generated by the first and second stigmator coils, when energized, have respective phases that differ from each other by effectively 90 degrees.

5. The apparatus of claim 1, wherein:
   the projection-optical system comprises a projection lens that, when energized, generates a respective magnetic field;
   the first and second stigmator coils are located within the magnetic field of the projection lens; and
   the magnetic field of the projection lens serves to rotate the imaging beam as required to achieve an adjustment of respective phases of the respective magnetic fields generated by the first and second stigmator coils.

6. The apparatus claim 1, wherein:
   the projection-optical system comprises first and second projection lenses each having a respective principal plane on the optical axis; and
   the position of the principal plane of the stigmator lens on the optical axis is either coincident with a principal plane of the first projection lens or is situated in a plane conjugate to a principal plane of the second projection lens.

7. The apparatus of claim 6, wherein:

the first stigmator coil, when energized, generates a magnetic-field strength ($A_1$) and is located an axial distance ($a_1$) from the principal plane of the stigmator lens;

the second stigmator coil, when energized, generates a magnetic-field strength ($A_2$) and is located an axial distance ($a_2$) from the principal plane of the stigmator lens; and the respective axial distances and magnetic-field strengths are related according to $a_1 A_1 = a_2 A_2$.

8. The apparatus of claim 6, wherein the first and second stigmator coils are located equidistantly from the principal plane of the stigmator lens and, when energized, generate respective magnetic fields of equal strength and effectively equal direction.

9. The apparatus of claim 6, wherein:

the first and second stigmator coils are located on the same axial side of the principal plane of the stigmator lens; and the magnetic fields generated by the first and second stigmator coils, when energized, have respective phases that differ from each other by effectively 90 degrees.

10. The apparatus of claim 6, wherein:

the projection-optical system comprises a projection lens that, when energized, generates a respective magnetic field;

the first and second stigmator coils are located within the magnetic field of the projection lens; and the magnetic field of the projection lens serves to rotate the imaging beam as required to achieve an adjustment of respective phases of the respective magnetic fields generated by the first and second stigmator coils.

11. The apparatus of claim 1, wherein:

the projection-optical system comprises a contrast aperture situated and configured to prevent charged particles propagating divergently from the reticle from propagating toward the sensitive substrate; and the position of the principal plane of the stigmator lens on the optical axis is at the contrast aperture or at a plane conjugate to the contrast aperture.

12. The apparatus of claim 11, wherein:

the first stigmator coil, when energized, generates a magnetic-field strength ($A_1$) and is located an axial distance ($a_1$) from the principal plane of the stigmator lens;

the second stigmator coil, when energized, generates a magnetic-field strength ($A_2$) and is located an axial distance ($a_2$) from the principal plane of the stigmator lens; and the respective axial distances and magnetic-field strengths are related according to $a_1 A_1 = a_2 A_2$.

13. The apparatus of claim 11, wherein the first and second stigmator coils are located equidistantly from the principal plane of the stigmator lens and, when energized, generate respective magnetic fields of equal strength and effectively equal direction.

14. The apparatus of claim 11, wherein:

the first and second stigmator coils are located on the same axial side of the principal plane of the stigmator lens; and the magnetic fields generated by the first and second stigmator coils, when energized, have respective phases that differ from each other by effectively 90 degrees.

15. The apparatus of claim 11, wherein:

the projection-optical system comprises a projection lens that, when energized, generates a respective magnetic field;

the first and second stigmator coils are located within the magnetic field of the projection lens; and the magnetic field of the projection lens serves to rotate the imaging beam as required to achieve an adjustment of respective phases of the respective magnetic fields generated by the first and second stigmator coils.

16. A charged-particle beam microlithography apparatus, comprising:

(a) an illumination-optical system situated and configured relative to a charged-particle-beam source and a pattern-defining reticle so as to direct a charged particle illumination beam from the source to illuminate a region of the pattern defined by the reticle;

(b) a projection-optical system situated on an optical axis extending between the reticle and a sensitive substrate, the projection-optical system being configured to receive an imaging beam, generated by passage of a portion of the illumination beam through the illuminated region of the reticle, and cause the imaging beam to form an image of the illuminated region on a corresponding region of the sensitive substrate; and (c) the projection-optical system comprising first and second projection lenses, a contrast aperture situated and configured to prevent charged particles scattered by the reticle from propagating toward the sensitive substrate, a first stigmator lens, and a second stigmator lens, wherein the first stigmator lens has a principal plane that is coincident with a principal plane of either the first or second projection lens, and the second stigmator lens has a principal plane that is coincident with a plane of the contrast aperture.

17. In a process for performing microlithography of a reticle pattern onto a sensitive substrate using a charged particle beam that passes, after passing through a region of a reticle illuminated by the charged particle beam, through a projection-optical system to the sensitive substrate, a method for reducing astigmatisms that otherwise would cause linear distortion and degradation of edge resolution of an image of the reticle pattern as projected onto the sensitive substrate by the projection-optical system, the method comprising:

(a) providing, in the projection-optical system, a stigmator lens comprising at least two stigmator coils and having a principal plane located at a position on an optical axis of the projection-optical system; and (b) energizing the stigmator coils to cause each stigmator coil to produce a respective magnetic-field strength and a respective convergence or divergence of the charged particle beam, wherein the position of the principal plane of the stigmator lens is a function of a ratio of the respective-field strengths and respective degrees of convergence or divergence exhibited by the stigmator coils.

18. The method of claim 17, wherein:

the first stigmator coil is energized to generate a magnetic-field strength ($A_1$) and is situated an axial distance ($a_1$) from the principal plane of the stigmator lens;

the second stigmator coil is energized to generate a magnetic-field strength ($A_2$) and is situated an axial distance ($a_2$) from the principal plane of the stigmator lens; and the respective axial distances and magnetic-field strengths are related according to $a_1 A_1 = a_2 A_2$.

19. In a process for performing microlithography of a reticle pattern onto a sensitive substrate using a charged particle beam that passes, after passing through a region of a reticle illuminated by the charged particle beam, through a projection-optical system to the sensitive substrate, a method for reducing astigmatisms that otherwise would cause linear distortion and degradation of edge resolution of an image of the reticle pattern as projected onto the sensitive substrate by the projection-optical system, the method comprising:

(a) providing, in the projection-optical system, first and second projection lenses, a contrast aperture, and first and second stigmator lenses;

(b) situating the contrast aperture to prevent charged particle scattered by the reticle from propagating toward the sensitive substrate; and (c) while passing the charged particle beam through the projection-optical system so as to transfer the reticle pattern to the substrate, causing a principal plane of the first stigmator lens to be coincident with a principal plane of either the first or second projection lens, and causing a principal plane of the second stigmator lens to be coincident with a plane of the contrast aperture, wherein linear distortion is corrected by the first stigmator lens and degradation of edge resolution is corrected by the second stigmator lens.

20. The process of claim 19, wherein degradation of edge resolution is corrected last.

\* \* \* \* \*

UNITED STATES PATENT AND TRADEMARK OFFICE
CERTIFICATE OF CORRECTION

PATENT NO. : 6,388,261 B1
DATED : May 14, 2002
INVENTOR(S) : Nakasuji

It is certified that error appears in the above-identified patent and that said Letters Patent is hereby corrected as shown below:

Column 2,
Line 47, "object the" should be -- object of the --.

Column 3,
Line 9, "a," should be -- $a_1$ --.

Column 8,
Line 11, "projection optical" should be -- projection-optical --.

Signed and Sealed this

Twenty-fifth Day of March, 2003

JAMES E. ROGAN
*Director of the United States Patent and Trademark Office*